US 6,724,671 B2

(12) United States Patent
Yumoto

(10) Patent No.: US 6,724,671 B2
(45) Date of Patent: Apr. 20, 2004

(54) NONVOLATILE SEMICONDUCTOR MEMORY DEVICE AND METHOD FOR TESTING THE SAME

(75) Inventor: Naotaka Yumoto, Kanagawa (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/208,829

(22) Filed: Aug. 1, 2002

(65) Prior Publication Data
US 2003/0058715 A1 Mar. 27, 2003

(30) Foreign Application Priority Data
Sep. 25, 2001 (JP) .......................... 2001-290550

(51) Int. Cl.[7] .............................................. G11C 16/06
(52) U.S. Cl. .............. 365/201; 365/185.09; 365/189.09
(58) Field of Search ...................... 365/201, 185.09, 365/189.09

(56) References Cited
U.S. PATENT DOCUMENTS
5,838,626 A * 11/1998 Nakayama .................. 365/226

* cited by examiner

Primary Examiner—Huan Hoang
(74) Attorney, Agent, or Firm—Volentine Francos, PLLC

(57) ABSTRACT

A nonvolatile semiconductor memory device and a method for testing the same by which the faulty memory device causing the unexpected data rewrite can be surely excluded. The test is carried out to judge whether or not a memory element storing a binary information corresponding to presence or not of an electric charge injected into a floating gate arranged on a semiconductor substrate so as to be electrically isolated therefrom, the semiconductor substrate including a source and a drain formed thereon, can exactly hold the electric charge injected to the floating gate in advance. In the test, an approximately equal voltage is applied to the source and drain as the voltage for drawing out the electric charge held in the floating gate.

22 Claims, 4 Drawing Sheets

NONVOLATILE SEMICONDUCTOR MEMORY DEVICE AND METHOD FOR TESTING THE SAME

BACKGROUND OF THE INVENTION

1. Field of the Invention

The present invention relates to a nonvolatile semiconductor memory device and a method for testing the same, and more particularly to a nonvolatile semiconductor memory device like an erasable and programmable read-only memory (referred to as 'EPROM' hereinafter), the information written to which can be erased by irradiation of ultraviolet rays, or an electrically erasable and programmable read-only memory (referred to as 'EEPROM' hereinafter), the information written to which can be electrically erased, and to a method for testing the EPROM or EEPROM.

2. Related Art

In the nonvolatile semiconductor memory device of the type as described above, there are used a lot of memory elements arranged as a matrix, of which each is provided with a floating gate and a control gate as well. The memory elements of this kind vary their threshold values depending on the presence or not of the electric charge injected into their floating gate.

For instance, in the memory element of the n-channel conductive type, the threshold value of the memory element can be made higher by injecting an electron into its floating gate, comparing with that of the memory element to which no electron injection is done. Accordingly, the information respectively stored in the electron injected memory element and the no electron injected memory element can be made out based on the difference between threshold values of these memory elements. For instance, when applying a predetermined gate voltage to the above-mentioned control gate, the data '0' can be read out from the electron injected memory element while the data '1' can be read out from the no electron injected memory element.

However, it would not be always guaranteed that the electric charge once injected into the floating gate of the memory element stably rests therein and the data '1' or '0' never fails to be read out correctly as described above. It might happen that the electric charge injected into the floating gate of the memory element is unexpectedly discharged for some unknown reason. In this case, the whole data are obliged to be rewritten. In order to prevent such an unexpected situation as described above, all the nonvolatile semiconductor memory devices newly coming from the production line are tested to examine if the electric charge injected into the floating gate is discharged or not under the predetermined load condition.

In order to carry out the prior art test of this kind, the electric charge is first injected in advance into the floating gate of all the memory elements. Then, a predetermined voltages are applied respectively to the source, drain and control gate of each electric charge injected memory element, for instance, 4.5V being applied to the drain by making use of the regulator incorporated into the nonvolatile semiconductor memory device, 3V to the source by making use of the write voltage for data latch, and 0V to the control gate.

If the electric charge once injected into the floating gate of the memory element is discharged by applying the above-mentioned voltages to the source, drain and control gate of the memory element, the memory element is judged to be a faulty product, and the nonvolatile semiconductor memory device including this faulty memory element is also judged to be a faulty product and is sorted out from normal products.

As described above, in the prior art test method, only a voltage lower than that of the drain was applied to the source of each memory element by making use of the write voltage from the data latch, so that this test method has not always satisfied the demand for the more severe and reliable test for sorting the faulty product. Accordingly, it has been desired to test the memory element under such a severer condition that the higher load is applied thereto, for instance.

SUMMARY OF THE INVENTION

Accordingly, an object of the invention is to provide a sorting test method capable of much more severely sorting out the faulty memory element than the prior art test method. Another object of the invention is to provide a nonvolatile semiconductor memory device capable of being tested by means of the more severer sorting test method than the prior art one.

In order to achieve the objects as described above, the invention adopts the following constitution.

Basically, the invention is characterized in that, in the test for judging whether or not a memory elements storing a binary information corresponding to the presence or not of an electric charge injected into a floating gate arranged on a semiconductor substrate so as to be electrically isolated therefrom, said semiconductor substrate including a source and a drain formed thereon, can exactly hold the electric charge injected to the floating gate in advance, an approximately equal voltage is applied to the source and drain as the voltage for drawing out the electric charge held in the floating gate.

According to the invention, an approximately equal voltage is applied to the source and drain as a voltage for drawing out the electric charge injected into the floating gate in advance.

Furthermore, the nonvolatile semiconductor memory device according to the invention includes a power source unit, which makes it easier to carry out the test method according to the invention.

BRIEF DESCRIPTION OF THE DRAWINGS

Certain preferred embodiments of the invention will now be described in detail by way of examples and with reference to the accompanying drawings, wherein constituents of the invention having substantially like function and structure in each of the several figures are identified by the like reference numeral or character in order to avoid the repetitive and redundant description thereabout, and wherein.

DETAILED DESCRIPTION OF THE PREFERRED EMBODIMENTS

[First Embodiment]

Figure 1:
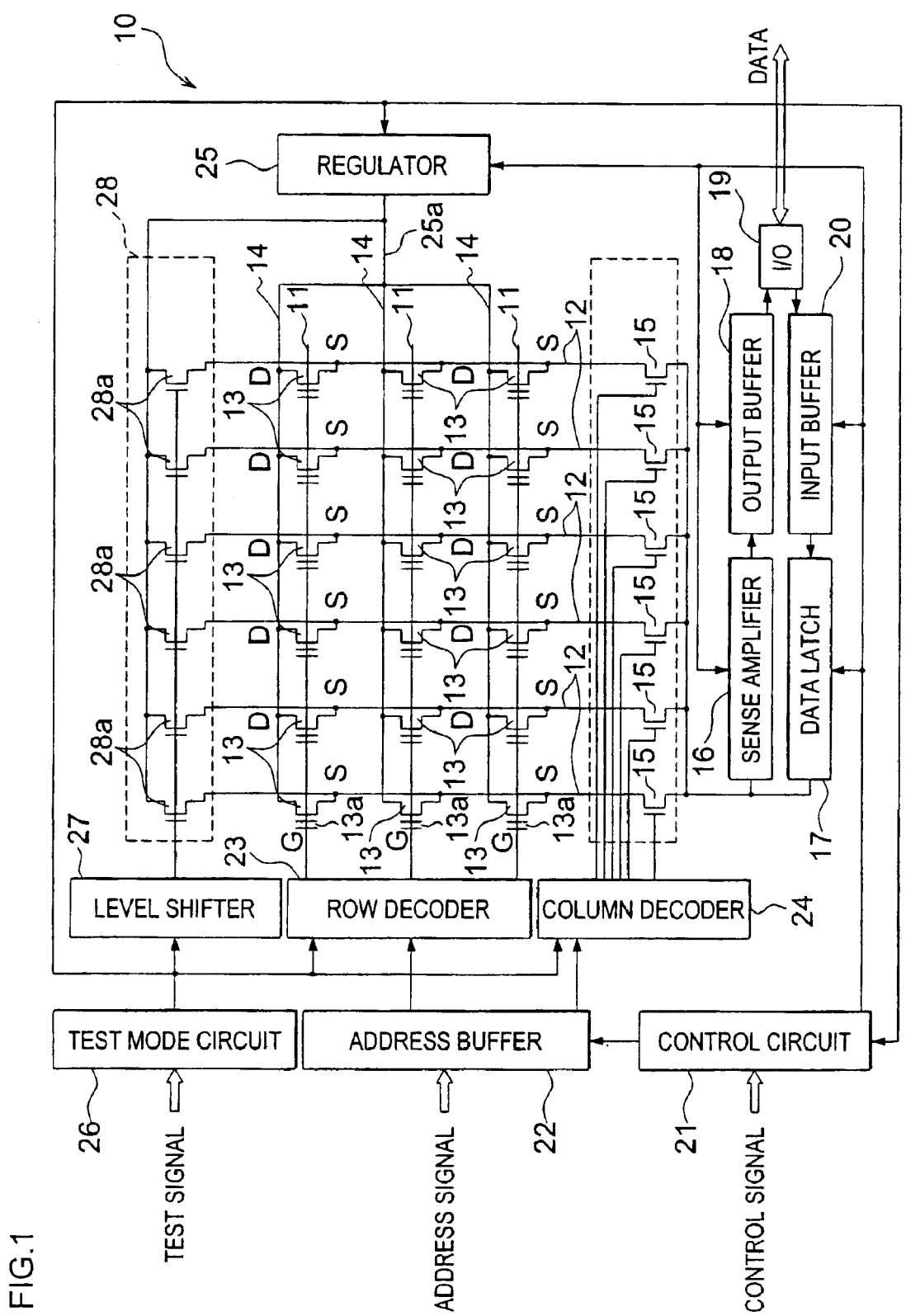
FIG. 1 is a circuit diagram showing the outline of a nonvolatile semiconductor memory device according to the first embodiment of the invention.

FIG. 1 is a circuit diagram showing the outline of a nonvolatile semiconductor memory device according to the first embodiment of the invention. This embodiment will be described by way of an EPROM as an example of the above-mentioned nonvolatile semiconductor memory device, the information written to which can be erased in a lump by irradiating it with ultraviolet rays.

As shown in FIG. 1, the nonvolatile semiconductor memory device 10 according to the present embodiment includes a plurality of word lines 11 arranged in parallel with each other, a plurality of bit lines 12 arranged such that they intersect the above word lines 11 at right angles, and a plurality of memory elements 13 arranged corresponding to every intersection point made by the above word and bit lines 11 and 12.

Furthermore, the nonvolatile semiconductor memory device 10 includes a plurality of selection lines 14 running between adjacent word lines 11 so as to be in parallel therewith, a plurality of selection transistors 15 made up of MOS transistors, a sense amplifier 16 for detecting the electric potential of the bit line 12, a data latch 17 for holding the data write potential to each bit line 12, an output buffer 18, a data I/O circuit 19, an input buffer 20, a control circuit 21, an address buffer 22, a row decoder 23, and a column decoder 24.

Still further, the nonvolatile semiconductor memory device 10 includes a regulator 25 generating a suitable voltage to be applied to the source S and the drain D of each memory element 13, a test mode circuit 26 receiving a test signal notifying the start of the test mode operation, a level shifter 27 converting the voltage of the test signal inputted to the test mode circuit 26, and a switching circuit 28 connecting each bit line 12 with the output line 25a of the regulator 25 based on the output signal from the level shifter 27.

The memory element 13 used herein is of the well known type wherein there are provided a pair of a source S and a drain D both of which are defined, for instance, as n-type impurity doped regions formed on a p-type semiconductor substrate (not shown), a floating gate 13a arranged above the region between the source S and the drain D such that it is electrically isolated from the semiconductor substrate, and a control gate G arranged still above the floating gate 13a such that it is electrically isolated from this floating gate.

In the memory element 13, if such a positive gate voltage that exceeds a predetermined threshold value viewing on the basis of the source S, is applied to the control gate G, an n-type conductive channel is formed between the source S and the drain D. Accordingly, the memory element 13 is an n-type conductive memory element wherein the source S and the drain D come in the conducting state with the help of the n-type conductive channel formed therebetween. If the electric charge is injected into the floating gate 13a, the threshold value of the electric charged injected memory element 13 is increased comparing with that of the no charge injected one. In the memory element 13 in which the n-type conductive channel is formed, the electron is used as the electric charge to be injected into the floating gate 13a.

In the memory element 13, a predetermined gate voltage is given, as a data read voltage, between the source S and the control gate G of the memory element 13, as described later.

In the memory element 13 in which no electron is injected into the floating gate 13a, the threshold value becomes relatively lower than the gate voltage at the time of the data read operation, so that the n-type conductive channel is formed between the source S and the drain D with the above readout voltage. This corresponds to the information '1,' for instance. Contrary to this, in the memory element 13 in which the electron is injected into its floating gate 13a, the threshold value becomes relatively higher than the gate voltage at the time of the data read operation, so that no channel is formed between the source S and the drain D with the above readout voltage. This corresponds to the information '0.'

Accordingly, the presence or not of the electric charge in the floating gate 13a of each memory element 13 corresponds to the information '0' or '1.'

Again referring to FIG. 1, the source S of each memory element 13 is connected with the bit line 12 of the corresponding column, and the drain D of each memory element 13 is connected with the selection line 14 extending between the adjacent word lines 11 to be in parallel therewith. Furthermore, the control gate G of each memory element 13 is connected with the word line 11 of the corresponding row.

Furthermore, each bit line 12 is connected, via each selection transistor 15 made up of a MOS transistor, with the sense amplifier 16 detecting the electric potential of the bit line 12 and also with the data latch 17 holding the data write electric potential for writing the data to each bit line 12. The sense amplifier 16 is connected with the data I/O circuit 19 via the output buffer 18, and the data latch 17 is connected with the data I/O circuit 19 via the input buffer 20.

In the nonvolatile memory device 10, a control signal is inputted to the control circuit 21 to select any one from among available operational modes, that is, the data write mode, the data readout mode, and the test mode.

Also, an address signal is inputted to the address buffer 22 in order to select the address of the memory element 13 to which the selected operational mode is applied.

The address buffer 22 outputs a word line selection signal to the row decoder 23, in order to select the word line 11 corresponding to the memory element 13 selected according to the address signal, and also outputs the bit line selection signal to the column decoder 24, in order to select the bit line 12 corresponding to the above memory element 13.

The row decoder 23 selects the word line 11 corresponding to the memory element 13 selected according to the word line selection signal.

The column decoder 24 puts the corresponding selection transistor 15 in the conducting state, in order to connect the bit line 12 corresponding to the above selected memory element 13 with the sense amplifier 16 and the data latch 17 as well according to the bit line selection signal.

The regulator 25 functions as a power source generating a suitable voltage to be applied to the source S and the drain D of each memory element 13 according to the selected available operational mode, that is, the data write mode, the data read mode, or the test mode.

The regulator 25 is able to generate several different voltages according to the operational mode selected based on the control signal from the control circuit 21. For instance, it generates 4.5V in the data write mode operation and the test mode operation as well while it generates 1.5V in the data read mode operation. The voltage as respectively generated is applied to the drain D of each memory element 13 via the selection line 14 connected with the output line 25a of the regulator 25.

Again referring to FIG. 1, the switching circuit 28 of the first embodiment includes a plurality of switching elements 28a, of which each is made up of the MOS transistor arranged on every bit line 12. While each switching element 28 is receiving the output signal from the level shifter 27 through the gate thereof, it continues to connect the corresponding bit line 12 with the output line 25a of the regulator 25.

Having received the above-mentioned test signal, the test mode circuit 26 transfers it respectively to the row decoder 23, the column decoder 25, and the control circuit 21, thereby putting each MOS transistor as the switching element 28a of the switching circuit 28 in the conducting state.

In the data write mode operation of the nonvolatile semiconductor memory device 10, the control circuit 21 controls the data latch 17 and the sense amplifier 16 as well such that the former is put in the activated state while the latter is put in the inactivated state. In this write mode operation, the regulator 25 outputs the write voltage of 4.5V to its output line 25a.

At this time, the test signal is not inputted to the test mode circuit 26, so that each switching element 28a of the switching circuit 28 electrically isolates the output line 25a from the bit line 12, thus any voltage generated by the regulator 25 being not applied to the bit line 12.

In the data write operation to each memory element 13, the data inputted to the data I/O circuit 19 is held as the write voltage in the activated data latch 17 through the input buffer 20.

When the data to be written is the information '1', the voltage of 3.0V is held in the data latch 17, for instance. When the data to be written is the information '0', the voltage of 0V is held in the data latch 17, for instance.

Accordingly, in the data write mode operation, for instance, the voltage of 8V from the row decoder 23 is applied to the control gate G of the memory element 13 selected according to the above-mentioned address signal, the voltage of 4.5V from the regulator 25 is applied to the drain D of the same, and the voltage 3.0V or 0V corresponding to the data from the data latch 17 is applied to the source S of the same.

When the voltage of 0V is applied to the source S of the selected memory element 13, the drain voltage expressed as the difference voltage 4.5V=4.5V−0V made by the voltages respectively applied to the drain D and the source S of the selected memory element 13, acts on the memory element 13, so that the hot electron generated by this drain voltage is injected into the floating gate 13a.

On the other hand, when the voltage of 3.0V is applied to the source S of the selected memory element 13, only the drain voltage expressed as the difference voltage 1.5=4.5V−3.0V made by the voltages respectively applied to the drain D and the source S of the selected memory element 13, acts on the memory element 13, so that the hot electron like the above can not be generated, thus no electron injection into the floating gate 13a being caused.

As a result, according to the write information '0' or '1' held in the data latch 17, the binary information corresponding to the presence or not of the electron injected into the floating gate 13a of the memory element 13, is written to this memory element 13.

The write cycle of the data to the memory element 13 is repeated with regard to all the memory elements 13 responding to the change of the address signal inputted to the address buffer 22. With this, the data write to each memory element 13 is finished.

In the nonvolatile semiconductor memory device 10 made up of EPROM's, the electron injected into the floating gate 13a of each memory element 13 can be drawn out by making use of the optical energy of the ultra violet rays irradiating each memory element 13, thus enabling the information stored in the nonvolatile semiconductor device 10 to be erased in a lump.

In the data read mode operation of the nonvolatile semiconductor memory device 10, the control circuit 21 controls the sense amplifier 16 and the data latch 17 as well such that the former is put in the activated state while the latter is put in the inactivated state. In this data read mode operation, the regulator 25 outputs the readout voltage of 1.5V to its output line 25a.

At this time, the test signal is not inputted to the test mode circuit 26, so that similar to the write mode operation, each switching element 28a of the switching circuit 28 puts the output line 25 and the bit line 12 in such a state they are electrically isolated from each other, thus no voltage generated from the regulator 25 being applied to the bit line 12.

In the data readout from the memory element 13, the electric potential of 0.1V for instance is given by the activated sense amplifier 16, to the bit line 12 selected according to the selection signal from the column decoder 24. On the other hand, the electric potential of 3.3V for instance is given to the word line 11 selected according to the selection signal from the row decoder 24.

Accordingly, as the voltages of 0.1V and 1.5V are applied to the source S and the drain D of the selected memory element 13, respectively, the voltage of about 1.4V is applied to the drain of the selected memory element 13 as the drain voltage. On one hand, as the voltage of 3.3V is applied to the control gate G, the voltage of the about 3.2V is applied between the source S and the control gate G of the selected memory element 13 as the gate voltage.

At this time, if no electron is injected into the floating gate 13a of the selected memory element 13, this memory element shows the threshold value lower than the above gate voltage, thereby the memory element 13 being put in the conducting state. Thus, the electric current comes to flow, through the selected memory element 13, to the bit line 12 connected therewith.

On the other hand, if the electron is injected into the floating gate 13a of the selected memory element 13, this memory element shows the threshold value higher than the above gate voltage, thereby the memory element 13 being not put in the conducting state but put in the non-conducting state.

As a result, the presence or not of the current flowing from the sequentially selected memory element 13 to the bit line 12 connected therewith is detected by the sense amplifier 16, and then, the detection result with regard to the presence or not of this detection current is externally outputted as a readout voltage from the nonvolatile semiconductor memory device 10 through the output buffer 18 and the data I/O circuit 19 connected therewith.

In the nonvolatile semiconductor memory device 10, the unexpected discharge of the electric charge injected into the floating gate 13a results in the unexpected data rewrite of the data. Therefore, before the actual use of the nonvolatile semiconductor memory device 10, it is tested whether or not there is a possibility that the unexpected data rewrite as called 'Bit Line Disturbance' takes place.

In this test mode operation, the electron is first injected into each floating gate 13a of all the memory elements 13, respectively.

Then, the test signal being inputted to the test mode circuit 26, the row decoder 23 having received this signal through the test mode circuit 26 puts all the word line 11 in the non-selection state, so that all the word line 11 is held at the voltage of 0V.

Also, the column decoder 24 receiving the above test signal through the test mode circuit 26, it holds all the selection transistors 15 in the non-selection state, that is, the non-conducting state.

On the other hand, the test mode circuit 26 receiving the above test signal, the level shifter 27 makes each switching element 28a of the switching circuit 28 conductive. With this, each bit line 12 corresponding to each switching element 28a is connected with the output line 25a of the regulator 25.

In the test mode operation, this regulator 25 then outputs the voltage of for instance 4.5V to apply it to the drain D of each memory element 13.

As the result of this, in the test mode operation of the nonvolatile semiconductor memory device 10, the voltage of 0V is applied to the control gate G of each memory element 13 while the voltage of 4.5V is equally applied to the source S and the drain D of the same, respectively.

In the prior art test, the voltage lower than the drain voltage, for instance 3.0V, was applied to the source S of each memory element 13 by making use of the write voltage from the data latch 17.

In contrast to this, in case of the nonvolatile semiconductor memory device 10 according to the first embodiment, the voltage of for instance 4.5V as the output from the regulator 25 can be equally applied to the source S and drain D, so that these source S and drain D can apply the approximately same strong draw-out force to the electron held in the floating gate 13a. Thus, this means that the test can be executed under the more severe condition, that is, under the condition using the higher load.

If it is found after executing the above test that no electron has been drawn out from the floating gate 13a of any memory element 13, in other words, if it is found that all the memory elements hold the information '0' in the readout mode operation, the nonvolatile semiconductor memory device 10 is judged to be an acceptable product. Contrary to this, even if only one memory element 13 holds the information '1', the nonvolatile semiconductor memory device 10 is judged to be a faulty product to be rejected.

As described above, in the test mode operation of the nonvolatile semiconductor memory device 10 according to the first embodiment, it becomes possible to apply the equal draw-out voltage for drawing out the electric charge, to the source S and drain D of the memory element 13. With this, it becomes possible to more surely exclude the faulty product that might cause unexpected data rewrite, thus the screening effect of the faulty product being enhanced.

[Second Embodiment]

Figure 2:
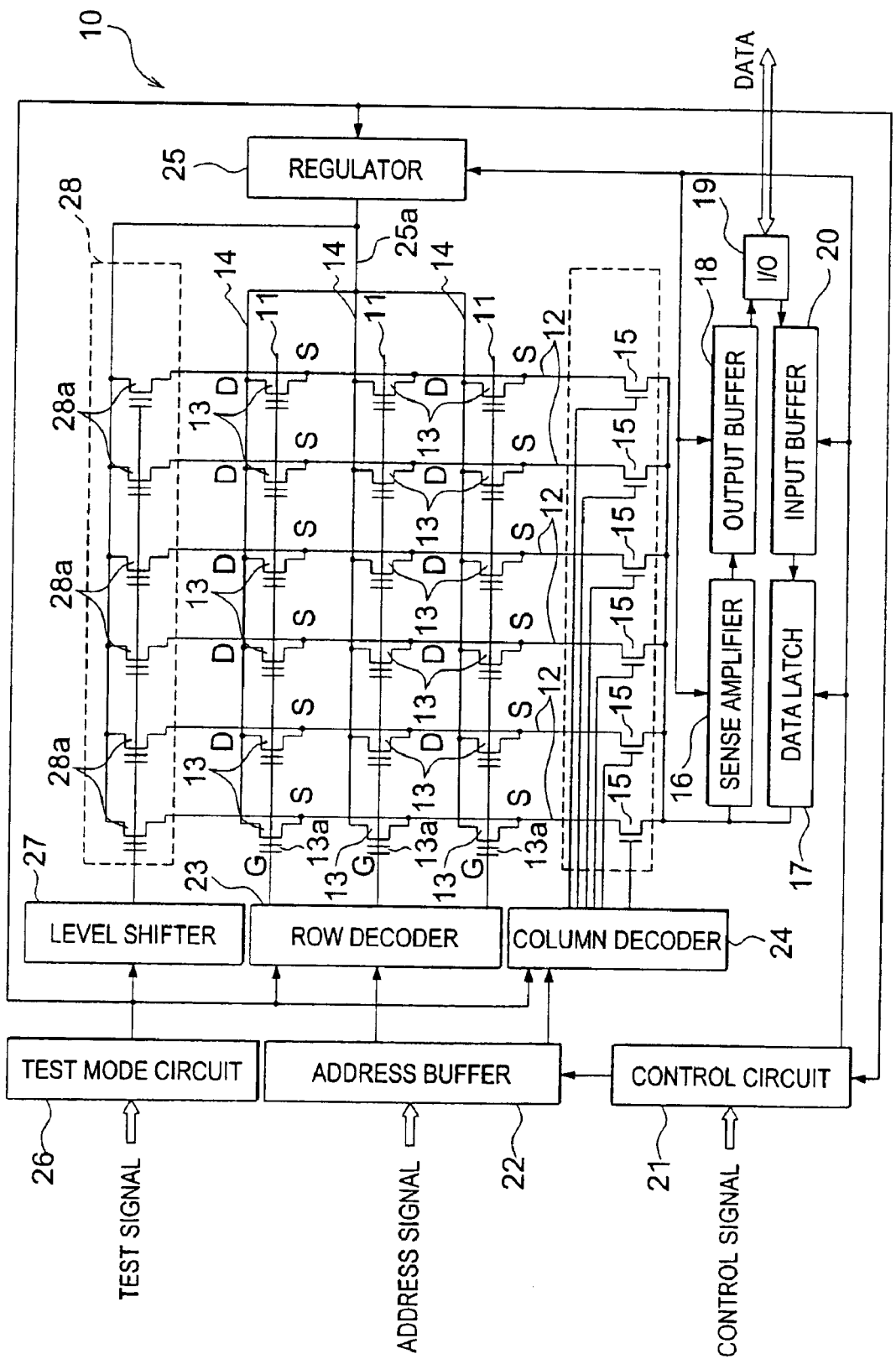
FIG. 2 is a circuit diagram showing the outline of a nonvolatile semiconductor memory device according to the second embodiment of the invention.

Now, referring to FIG. 2 showing the second embodiment according to the invention, it will be understood from this figure that the switching element 28a forming the switching circuit 28 has the same element structure as the memory element 13.

In this example, there is no need for the electric charge to be injected into the floating gate 13a of each switching element 28. Instead, the voltage exceeding the threshold value of that switching element is applied to the control gate G of each switching element 28a from the level shifter 27.

Furthermore, instead of injecting the electric charge into the floating gate 13a of each switching element 28a, there can be used the switching elements 28a, into the floating gate 13a of which no electric charge is injected.

As already described in connection with the first embodiment, the switching circuit 28 has been formed as an peripheral circuit including a plurality of MOS transistors i.e. switching elements 28a. According to the second embodiment, however, the switching circuit 28 is formed by making use of switching elements 28a having the same structure as the memory element 13, which can be more miniaturized in comparison with the MOS transistor as used in the first embodiment. Accordingly, it is possible to suppress that the nonvolatile semiconductor memory device 10 becomes larger in the size thereof.

[Third Embodiment]

The first and second embodiments shown in FIGS. 1 and 2, have been described by way of the example in which each switching element 28a is provided in correspondence with each bit line 12. In the third embodiment shown in FIG. 3, a switching circuit 28 can be formed by means of a single switching element which is provided between each bit line 12 and the output line 25a of the regulator 25 and executes the open/shut operation in response to the test signal from the level shifter 27.

Figure 3:
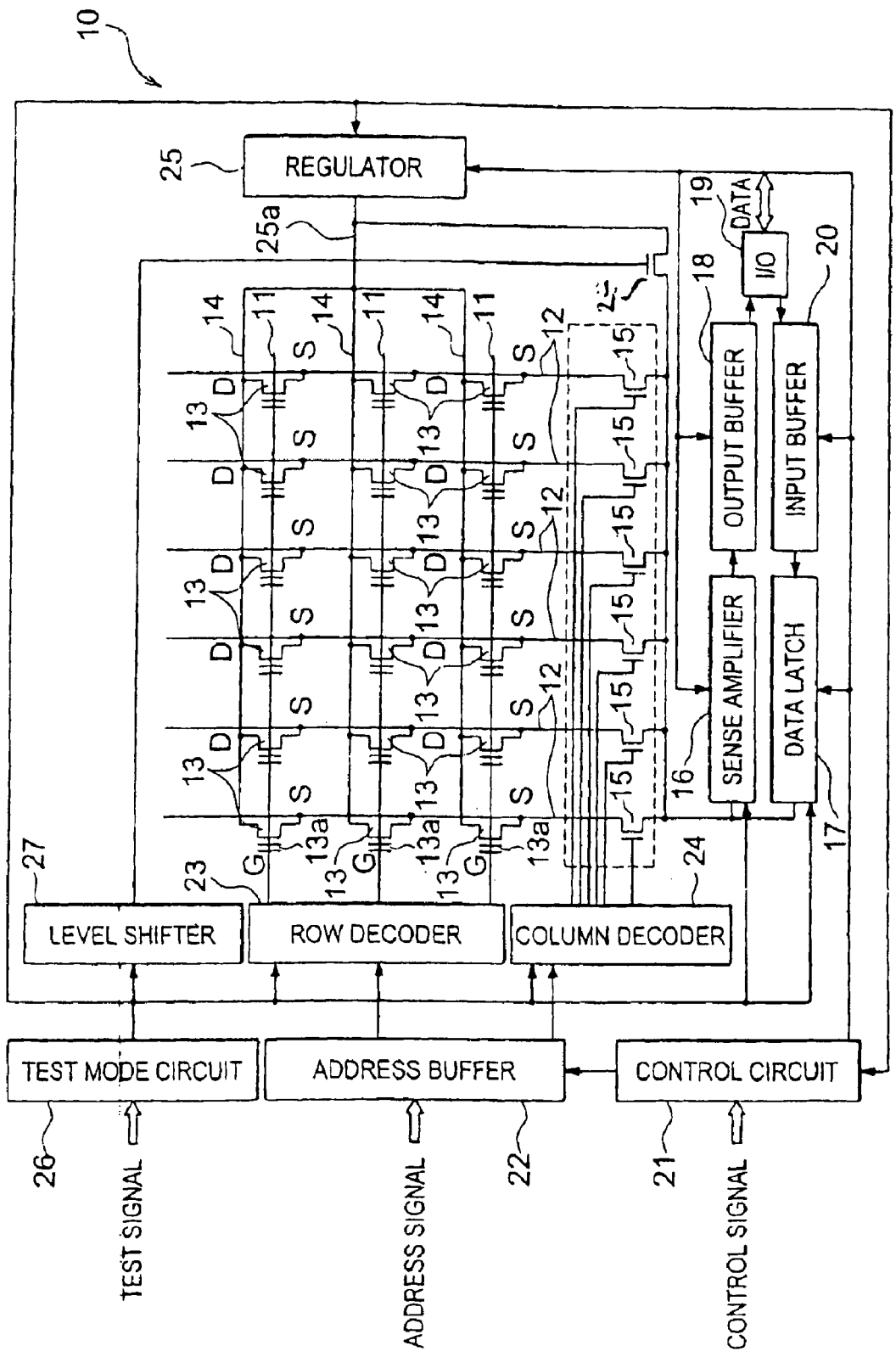
FIG. 3 is a circuit diagram showing the outline of a nonvolatile semiconductor memory device according to the third embodiment of the invention.

The switching element shown in FIG. 3 is basically the same switching element as each switching element 28a adopted by the first embodiment and is able to be formed by means of the MOS transistor having the gate receiving the signal from the level shifter 27, the source and the drain.

The source and drain of this switching element 28 are inserted between the output line 25a of the regulator 25 and a collective line connected with all the bit lines 12, so that receiving the test signal from the level shifter 27, the switching element 28 connects all the bit lines 12 with the output line 25a of the regulator 25 in a lump.

In the third embodiment shown in FIG. 3, each selection transistor 15 is arranged between the switching element 28 and each bit line 12, so that in the test mode operation, the selection transistor 15 is put in the conducting state according to the selection signal from the column decoder 24. Therefore, in the test mode operation, the sense amplifier 16 and the data latch 17, both of which are connected with each bit line 12, respectively, are held in the inactivated state by the control signal from the control circuit 21.

As described above, in the nonvolatile semiconductor memory device 10 according to the third embodiment, the switching circuit 28 can be realized by means of the single switching element 28, so that the packaging space of the nonvolatile semiconductor memory device 10 is advantageously prevented from being enlarged uselessly.

[Fourth Embodiment]

Figure 4:
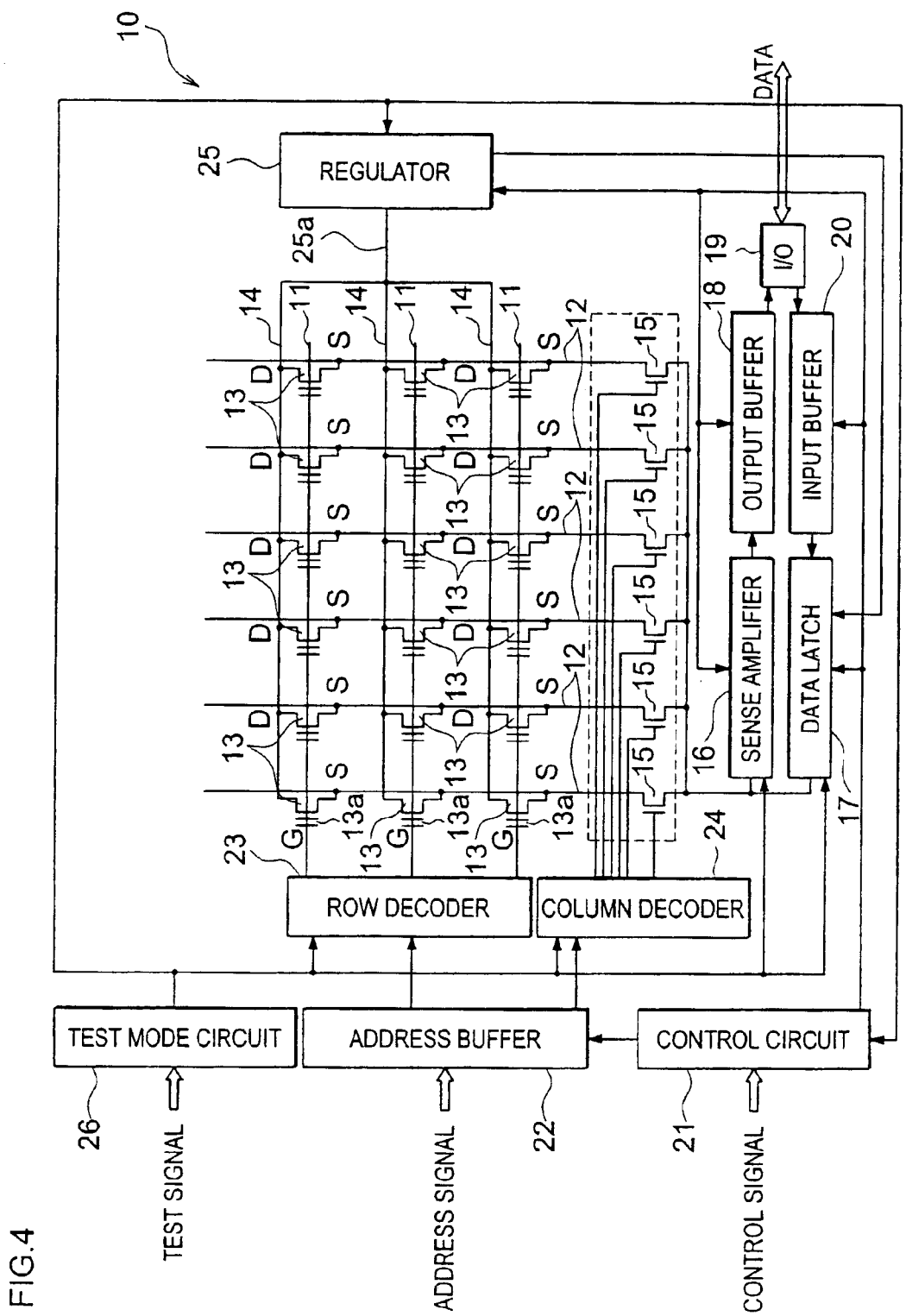
FIG. 4 is a circuit diagram showing the outline of a nonvolatile semiconductor memory device according to the fourth embodiment of the invention.

Now, let us refer to FIG. 4 showing the fourth embodiment according to the invention. In this embodiment, there is not provided such a switching circuit 28 that is used in the first through third embodiments of the invention. Instead of the switching circuit 28, there may be provided a circuit serving as follows. That is, in the test mode operation, the circuit applies a predetermined voltage outputted to the output line 25a of the regulator 25 to the drain D of each memory element 13 through each selection line 14, and at the same time, has the data latch 17 held the voltage of the output line 25a, and then applies the voltage of the output line 25a to the source S of each memory element 13 through the data latch 17.

According to the fourth embodiment, in the test mode operation, it becomes possible to have the output voltage from the regulator 25 acted on the source S and drain D of the memory element 13 by addition of the wiring extending from the regulator 25 to the data latch 17 and programming of the control circuit 21, so that there is no need to provide the switching circuit 28 for connecting the bit line 12 with the output line 25a of the regulator 25. Accordingly, the fourth embodiment is most advantageous with regard to the design of the nonvolatile semiconductor memory device 10, especially the design relating to the space for packaging various elements of the memory device.

In the explanation about the several embodiments according to the invention, the regulator 25 has been used as a power source in the test mode operation. However, it is possible to use an internal power source other than the regulator 25 in order to realize the nonvolatile semiconductor memory device according to the invention. Furthermore, in order to execute the test method according to the invention, it is possible to use the power source other than the regulator 25 incorporated in the nonvolatile semiconductor memory device 10, or an external power source not incorporated in the nonvolatile semiconductor memory device 10.

In the above description, the value of each voltage applied to the floating gate 13a, the source S and the drain D of each memory element 13 is merely an example for the purpose of explaining the invention. Therefore, various voltage values may be adopted taking account of the characteristic of the memory element 13 as far as the voltages applied to the source S and the drain D, respectively, are approximately equal to each other.

The invention has been described so far by way of the memory element having the n-type conductive channel formed by the electron. However, the invention is also applicable to the memory element having the p-type conductive channel formed by the hole.

The invention has been described so far by way of the EPROM as the nonvolatile semiconductor memory device in which the data write is carried out by making use of the hot electron. However, the invention is applicable to the nonvolatile semiconductor memory device of the other type and the method for testing thereof, for instance a so-called One-Time PROM (OTP) covered by a package having no quartz glass window for irradiation of ultra violet rays, an EEPROM of which the written information can be electrically erased, and so forth.

Moreover, for example, the present may be applicable to the following test method.

A method for testing a nonvolatile semiconductor memory device for judging whether or not a memory element can surely hold the electric charge injected into the floating gate in advance, said memory element storing a binary information corresponding to whether or not an electric charge has been injected into a floating gate arranged on a semiconductor substrate so as to be electrically isolated therefrom, said semiconductor substrate including a source and a drain formed thereon, wherein the test is carried out by applying an approximately equal voltage to the source and drain as a voltage for drawing out the electric charge held by the floating gate.

The voltage of 4.5V may be applied to the source and drain as a test voltage.

While preferred embodiments of the nonvolatile semiconductor memory device and the method for testing the same according to the invention have been discussed with reference to the accompanying drawings, the invention is not limited to these embodiments as shown in the drawings and described in this specification. It will be apparent to those skilled in the art that changes and modifications can be made without departing from the principle and spirit of the invention, the scope of which is defined in the appended claims, and it is understood that those changes and modifications also belong to the technical scope of the invention.

What is claimed is:

1. A nonvolatile semiconductor memory device comprising:
   a plurality of memory elements each of which stores a binary information corresponding to an electric charge injected into a floating gate arranged on a semiconductor substrate so as to be electrically isolated from said semiconductor substrate, and each of which including a source and a drain formed on said semiconductor substrate; and
   a power source unit applying an approximately same voltage to said sources and said drains in a test mode operation for judging whether the electric charge injected into said floating gates in advance can be held or not,
   wherein said power source unit includes a power source applying a predetermined voltage to said drains in the test mode operation, and a switching element inserted between said power source and said sources, in order to apply a predetermined same voltage to said sources and said drains by using said power source as a common power source in the test mode operation,
   wherein a plurality of bit lines are each electrically connected to respective ones of said plurality of memory elements and said switching element, and
   wherein said switching element is formed of an element having a same structure as an element forming said memory elements.

2. A nonvolatile semiconductor memory device as claimed in claim 1, wherein said memory elements each further include a control gate arranged on said floating gate so as to be electrically isolated therefrom, and each of said memory elements exhibit electrical conduction via an n-type channel formed between said source and said drain when a gate voltage exceeding a threshold value is applied to said control gate, and wherein during said test mode operation a positive voltage with respect to said control gate is applied to said source and said drain.

3. A nonvolatile semiconductor memory device as claimed in claim 2, wherein during said test mode operation the predetermined same voltage is applied to said sources and said drains while said control gates are held at a voltage of 0V.

4. A nonvolatile semiconductor memory device as claimed in claim 1, wherein said memory elements each further include a control gate arranged so as to be electrically isolated from said floating gate, and each of said memory elements exhibit electrical conduction via a p-type channel formed between said source and said drain when a gate voltage less than a threshold value is applied to said control gate, and wherein during said test mode operation, a positive voltage with respect to said control gate is applied to said source and said drain.

5. A nonvolatile semiconductor memory device as claimed in claim 4, wherein during said test mode operation, the predetermined same voltage is applied to said sources and said drains while said control gates are held at a voltage of 0V.

6. A nonvolatile semiconductor memory device as claimed in claim 1, wherein said power source comprises a regulator capable of applying a predetermined voltage to said drain according to various operational modes including a data read mode, a date write mode, and the test mode operation.

7. A nonvolatile semiconductor memory device comprising:

a plurality of memory elements each of which stores a binary information corresponding to an electric charge injected into a floating gate arranged on a semiconductor substrate so as to be electrically isolated from said semiconductor substrate, and each of which including a source and a drain formed on said semiconductor substrate; and a power source unit applying an approximately same voltage to said sources and said drains in a test mode operation for judging whether the electric charge injected into said floating gates in advance can be held or not, wherein said power source unit includes a power source applying a predetermined voltage to said drains in the test mode operation, and a switching element inserted between said power source and said sources, in order to apply a predetermined same voltage to said sources and said drains by using said power source as a common power source in the test mode operation, wherein said power source comprises a regulator capable of applying a predetermined voltage to said drain according to various operational modes including a data read mode, a data write mode, and the test mode operation, and wherein during the test mode operation, the predetermined voltage of said regulator is applied to said sources through a latch that temporarily holds data written to said memory elements during the data write mode.

8. A nonvolatile semiconductor memory device comprising:

a plurality of memory elements each of which stores a binary information corresponding to an electric charge injected into a floating gate arranged on a semiconductor substrate so as to be electrically isolated from said semiconductor substrate, and each of which including a source and a drain formed on said semiconductor substrate; and a power source unit applying an approximately same voltage to said sources and said drains in a test mode operation for judging whether the electric charge injected into said floating gates in advance can be held or not, wherein said power source unit includes a power source applying a predetermined voltage to said drains in the test mode operation, and a switching element inserted between said power source and said sources, in order to apply a predetermined same voltage to said sources and said drains by using said power source as a common power source in the test mode operation, and wherein a plurality of bit lines are each electrically connected to respective ones of said plurality of memory elements, and said plurality of bit lines are connectable with said power source via said switching element which is a single switch.

9. A nonvolatile semiconductor memory device comprising:

a plurality of memory elements each of which stores a binary information corresponding to an electric charge injected into a floating gate arranged on a semiconductor substrate so as to be electrically isolated from said semiconductor substrate, and each of which including a source and a drain formed on said semiconductor substrate; and a power source unit applying an approximately same voltage to said sources and said drains in a test mode operation for judging whether the electric charge injected into said floating gates in advance can be held or not, wherein said power source unit applies a voltage of 4.5V equally to said sources and said drains during the test mode operation.

10. A method for testing a nonvolatile semiconductor memory device for judging whether or not a memory element can hold electric charge injected in advance into a floating gate of said memory element, said memory element storing a binary information corresponding to whether or not the electric charge has been injected into said floating gate which is arranged on a semiconductor substrate so as to be electrically isolated from said semiconductor substrate, said semiconductor substrate including a source and a drain formed thereon, the method for testing comprising applying an approximately equal voltage to the source and the drain as a test voltage for drawing out the electric charge held by the floating gate, wherein a voltage of 4.5V is applied to said source and said drain as the test voltage.

11. A nonvolatile memory device comprising:

a plurality of floating gate type memory cell transistors formed on a semiconductor substrate, each of the cell transistors having a source, a drain and a control gate;

a plurality of word lines connected to the control gates of the cell transistors;

a plurality of bit lines connected to the sources of the cell transistors;

a select line connected to the drains of the cell transistors;

a test mode circuit that outputs a test mode signal;

a regulator connected to the test mode circuit, that provides a first voltage to the select line in response to the test mode signal; and a switching circuit that connects the select line with the bit lines in response to the test mode signal, wherein the switching circuit includes a plurality of switching transistors each of which is connected between the select line and one of the bit lines, and wherein the switching transistors are floating gate type transistors.

12. A nonvolatile memory device as claimed in claim 11, further comprising an address circuit connected to the word lines and the bit lines that selects one of the word lines and one of the bit lines in response to an address signal.

13. A nonvolatile memory device as claimed in claim 12, wherein the address circuit includes an address buffer receiving the address signal, a row decoder connected to the address buffer and the word lines, and a column decoder connected to the address buffer and the bit lines.

14. A nonvolatile memory device as claimed in claim 11, further comprising an input/output circuit that transfers data received from one of the cell transistors and received from externally of the nonvolatile memory device.

15. A nonvolatile memory device as claimed in claim 14, wherein the input/output circuit includes a sense amplifier, a data latch circuit, an output buffer circuit and input buffer circuit.

16. A nonvolatile memory device as claimed in claim 14, further comprising a plurality of selecting transistors each of which is connected to the input/output circuit and respective ones of the bit lines.

17. A nonvolatile memory device as claimed in claim 11, further comprising a control circuit, connected to the regulator, that provides a control signal.

18. A nonvolatile semiconductor memory device comprising:
- a plurality of word lines;
- a plurality of bit lines;
- a selection line;
- a plurality of floating gate type memory cell transistors, wherein each memory cell transistor has a control gate connected to one of the word lines, a source connected to one of the bit lines, and a drain connected to the selection line;
- a regulator which supplies the selection line with a voltage responsive to a test signal;
- a data latch circuit which holds the voltage supplied by the regulator; and
- a plurality of selection transistors which electrically connect the bit lines and the data latch circuit.

19. A nonvolatile memory device as claimed in claim 18, further comprising an address circuit, connected to the word lines and the bit lines, that selects one of the word lines and one of the bit lines in response to an address signal.

20. A nonvolatile memory device as claimed in claim 19, wherein the address circuit includes an address buffer receiving an address signal, a row decoder connected to the address buffer and the word lines, and a column decoder connected to the address buffer and the bit lines.

21. A nonvolatile memory device as claimed in claim 18, further comprising an input/output circuit that transfers data received from one of the cell transistors and from externally of the nonvolatile memory device.

22. A nonvolatile memory device as claimed in claim 21, wherein the input/output circuit includes a sense amplifier, a data latch circuit, an output buffer circuit and input buffer circuit.

* * * * *